(12) United States Patent
Wu et al.

(10) Patent No.: US 11,322,897 B2
(45) Date of Patent: May 3, 2022

(54) CABLE CONNECTOR, CABLE CLAMP, AND METHOD FOR DETECTING BRIDGING OF CAR BATTERIES

(71) Applicant: Zhejiang Safemate Automotive Safety & Emergency Technology Co., Ltd., Hangzhou (CN)

(72) Inventors: Zhonghua Wu, Hangzhou (CN); Naixing Wang, Hangzhou (CN); Wei Wang, Hangzhou (CN)

(73) Assignee: Zhejiang Safemate Automotive Safety & Emergency Technology Co., Ltd., Hangzhou (CN)

( * ) Notice: Subject to any disclaimer, the term of this patent is extended or adjusted under 35 U.S.C. 154(b) by 313 days.

(21) Appl. No.: 16/747,962

(22) Filed: Jan. 21, 2020

(65) Prior Publication Data
US 2021/0006018 A1    Jan. 7, 2021

(30) Foreign Application Priority Data
Nov. 22, 2018    (CN) .......................... 201811395985.7

(51) Int. Cl.
| | |
|---|---|
| *H01R 13/66* | (2006.01) |
| *G01R 31/3842* | (2019.01) |
| *H01R 13/70* | (2006.01) |
| *H01R 13/717* | (2006.01) |

(52) U.S. Cl.
CPC ..... *H01R 13/6683* (2013.01); *G01R 31/3842* (2019.01); *H01R 13/6691* (2013.01); *H01R 13/70* (2013.01); *H01R 13/717* (2013.01)

(58) Field of Classification Search
None
See application file for complete search history.

(56) References Cited

U.S. PATENT DOCUMENTS

| | | | | |
|---|---|---|---|---|
| 5,343,135 | A * | 8/1994 | Mathieson | H02J 7/10 324/2 |
| 2013/0057255 | A1* | 3/2013 | Hou et al. | G01R 21/006 324/126 |

* cited by examiner

*Primary Examiner* — Jas A Sanghera
(74) *Attorney, Agent, or Firm* — Schwegman Lundberg & Woessner, P.A.

(57) ABSTRACT

A cable connector, a cable clamp, and a method for detecting bridging of car batteries. The cable connector includes a housing and a wiring circuit, wherein the wiring circuit is arranged in the housing and includes a first wiring terminal, a second wiring terminal, and a detection module and voltage absorption module electrically connected between the first wiring terminal and the second wiring terminal, and a voltage absorption module. The voltage absorption module includes a piezoresistor bridged between the first wiring terminal and the second wiring terminal. The detection module includes a first switch circuit and a second switch circuit which are oppositely bridged between the first wiring terminal and the second wiring terminal to be alternatively turned on, wherein the first switch circuit includes a first illumination unit, and the second switch circuit includes a second illumination unit.

15 Claims, 3 Drawing Sheets

CABLE CONNECTOR, CABLE CLAMP, AND METHOD FOR DETECTING BRIDGING OF CAR BATTERIES

CROSS-REFERENCE TO RELATED APPLICATIONS

This Non-provisional application claims priority under 35 U.S.C. § 119(a) on Chinese Patent Application No(s). 201811395985.7 filed on Nov. 22, 2018, the entire contents of which are hereby incorporated by reference in their entirety.

TECHNICAL FIELD

The invention relates to a field of vehicle control, in particular to a cable connector, a cable clamp, and a method for detecting bridging of car batteries.

DESCRIPTION OF RELATED ART

With the improvement of living standards, cars have become a necessity of people in daily life. In the case where the cars fail to start during driving due to the lack of electricity in car batteries, the cars have to be started with the assistance of a battery of another car. In this case, cable clamps and cables are used to electrically connect the batteries of two cars.

With regard to a correct operating method of the cable clamps, the positive poles of the batteries of the two cars are connected with each other through red jumper wires in the cables, and the negative pole of the battery of the rescue car is connected to the ground pole of the other car through a black jumper wire, so that the batteries of the two cars are bridged. In terms of the electrical principle, the two batteries of the two cars are connected in parallel to form a new battery through cable connection.

In the above operating process, due to the fact that the car batteries may run out of electricity at any time, cable connection is usually carried out under a dark condition at night, and in this case, red jumper wires and the black jumper wire may fail to be correctly connected due to poor lighting, for instance, the red jumper wires are connected to the negative poles, while the black jumper wire is connected to the positive pole of the battery. If this is the case, the batteries of the two cars may be damaged.

Thus, there is a need for a novel cable clamp which can inform users of reverse connection in time when cables are reversely connected, so as to guarantee the safety of the users and cars.

BRIEF SUMMARY OF THE INVENTION

The objective of the invention is to overcome the above-mentioned technical defects by providing a cable connector, a cable clamp, and a method for detecting bridging of car batteries to intelligently detect the on-state and connection polarities of batteries so as to protect electrical appliances in cars against damage caused by surge currents.

The invention discloses a cable connector including a housing and a wiring circuit, wherein the wiring circuit is arranged inside the housing and the wiring circuit includes a first wiring terminal, a second wiring terminal, a detection module, and a voltage absorption module, the detection module and the voltage absorption module electrically connected between the first wiring terminal and the second wiring terminal;

the voltage absorption module includes a piezoresistor bridged between the first wiring terminal and the second wiring terminal;

the detection module includes a first switch circuit and a second switch circuit, the first switch circuit and the second switch circuit are oppositely bridged between the first wiring terminal and the second wiring terminal to be alternatively turned on, the first switch circuit includes a first illumination unit, and the second switch circuit includes a second illumination unit; and when the first wiring terminal and the second wiring terminal are positively connected to two power supplies, the first switch circuit is turned on and the first illumination unit illuminates for a display; and when the first wiring terminal and the second wiring terminal are negatively connected to two power supplies, the second switch circuit is turned on, and the second illumination unit illuminates for a display.

Preferably, the first switch circuit may include a first resistor and a first diode connected in series, wherein the first diode may have a positive pole connected to the first wiring terminal through the first resistor and a negative pole connected to the second wiring terminal; and the second switch circuit may include a second resistor and a second diode connected in series, wherein the second diode may have a negative pole connected to the first wiring terminal and a positive pole connected to the second wiring terminal through the second resistor.

Preferably, the first resistor may have a resistance between 500Ω-1500Ω; the second resistor may have a resistance between 1000Ω-3000Ω.

Preferably, the wiring circuit further may include an alarm module, the alarm module may be bridged between the first wiring terminal and the second wiring terminal and the alarm module may be activated to send out an alarm signal when the first wiring terminal and the second wiring terminal are negatively connected to the power supplies.

Preferably, the alarm module may include a third diode, a third resistor, a buzzing unit, and a fourth diode;

one terminal of the third diode may be connected to the second wiring terminal and the other terminal of the third diode may be connected to one terminal of the third resistor;

the other terminal of the third resistor may be connected to the buzzing unit;

one terminal of the fourth diode may be connected to the buzzing unit and the other terminal of the fourth diode may be connected to the first wiring terminal; and a positive pole of the third diode may be connected to the second wiring terminal and a negative pole of the third diode may be connected to the third resistor.

Preferably, a first voltage threshold may be preset in the piezoresistor to detect a voltage flowing through the first wiring terminal and the second wiring terminal;

when the voltage flowing through the first wiring terminal and the second wiring terminal may be greater than the voltage threshold, the piezoresistor absorbs an over-current flowing through the first wiring terminal and the second wiring terminal.

Preferably, the voltage threshold may be 33V, and the over-current may be less than or equal to 2000 A.

The invention also discloses a cable clamp, wherein the cable clamp includes a cable and any one of the above-mentioned cable connector, wherein the cable is connected to the first wiring terminal of the cable connector and the second wiring terminal of the cable connector respectively.

The invention also discloses a method for detecting bridging of car batteries, including the following steps:

S100: respectively connecting a first cable and a second cable of a cable clamp to two car batteries;

S200: when a first wiring terminal connected to the first cable and a second wiring terminal connected to the second cable are positively connected between the two car batteries, turning on a first switch circuit in a cable connector, and controlling a first illumination unit to illuminate for a display;

S200': when the first wiring terminal connected to the first cable and the second wiring terminal connected to the second cable are negatively connected between the two car batteries, turning on a second switch circuit in the cable connector, and controlling a second illumination unit to illuminate for a display and an alarm module to send out an alarm signal; and S300: when a voltage flowing through the first wiring terminal and the second wiring terminal exceeds a voltage threshold preset in a piezoresistor in the cable connector, absorbing an over-current flowing through the first wiring terminal and the second wiring terminal by means of the piezoresistor.

By adoption of the above technical solution, the invention has the following beneficial effects against the prior art:

1. When a short circuit of the batteries causes an over-voltage or over-current to the cables or generates a high-voltage pulse or high-voltage static, the voltage absorption module absorbs the over-voltage or the over-current in real time to protect electrical appliances in cars against damage;

2. The cable clamp has an operating range of DC 6V-30V, thus being applicable to the cars starting at different voltages; and 3. The connection condition is intelligently displayed by detecting the on-state and polarities of the batteries.

Figure 1:
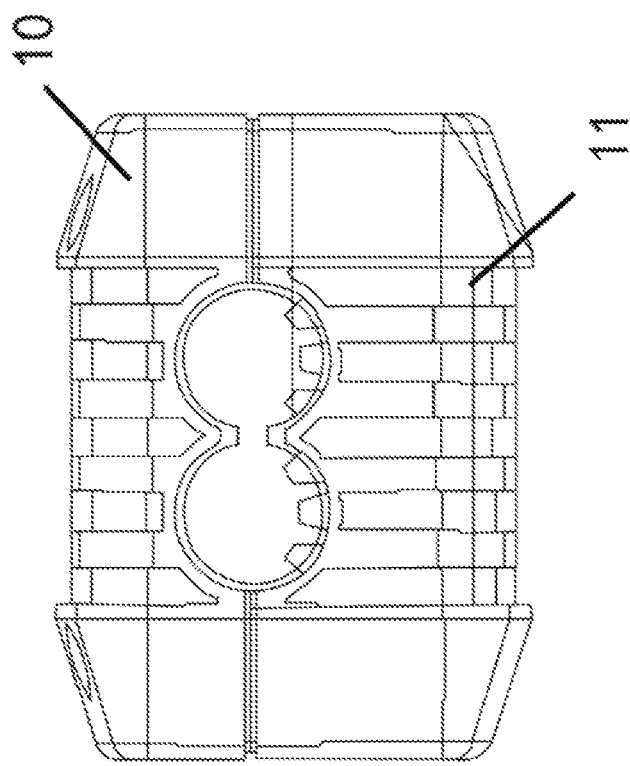
FIG. 1 is a structural view of a cable connector in an embodiment of the invention.

REFERENCE SIGNS 10, cable connector; 11, housing; 22, detection module; 21, voltage adsorption module; 23, alarm module.

DETAILED DESCRIPTION OF THE INVENTION

The advantages of the invention are further expounded below in combination with the accompanying drawings and specific embodiments.

Illustrative embodiments are described in detail herein and are illustrated in the accompanying drawings. In the following description involving the accompanying drawings, unless otherwise indicated, the same number in different drawings represents the same or similar elements. Implementations described in the following illustrative embodiments do not represent all possible ones consistent with the present disclosure, and are only examples of devices and methods expounded in the appended claims and consistent with some aspects of this present disclosure.

Terms in this present disclosure are used only for describing specific embodiments, and are not intended to limit the present disclosure. Unless otherwise clearly specified in the context, "a", "the", and "the" used in singular forms in this present disclosure and the appended claims are intended to include plural forms. It should also be understood that terms such as "and/or" used herein refer to and include any or all possible combinations of one or more associated items listed.

It should be understood that although terms such as first, second, third, and the like may be adopted in this present disclosure to describe various information, such information should not be limited to these terms. These terms are only used to distinguish information of the same type. For instance, first information may also be referred to as second information without deviating from the scope of this present disclosure, and similarly, the second information may also be referred to as the first information. Depending on the context, a word such as "if" used herein can be interpreted as "at", "when", or "determination in response to".

In the description of the invention, it can be understood that the directional or positional relations indicated by terms such as "longitudinal", "transverse", "upper", "lower", "front", "rear", "left", "right", "vertical", "horizontal", "top", "bottom", "internal", and "external" are only used to facilitate and simplify the description of the invention based on directional or positional relations shown in the accompanying drawings, and do not indicate or hint that devices or elements referred to must have specific directions or must be formed and operated in specific directions, and thus, these terms should not to be appreciated as limitations of the invention.

In the description of the invention, unless otherwise specified and limited, it should be noted that terms such as "installation", "connected", and "connection" should be understood broadly. For instance, the "connection" may refer to mechanical connection, electrical connection, and internal communication of two elements, direct connection, or indirect connection via a medium. Those ordinarily skilled in this field can understood the specific meanings of the above-mentioned terms in the invention as the case may be.

In the following description, a suffix of an element such as "module", "part", or "unit" is merely used to facilitate the explanation of the invention and has no specific meaning. Thus, the "module" and the "part" can be used in combination.

FIG. 1 shows a structural view of a cable connector 10 in an embodiment of the invention. In this embodiment, the cable connector 10 includes a housing 11 and a wiring circuit, wherein the wiring circuit is installed inside the housing 11 and is wrapped with the housing 11 to be prevented against contact with vapors, fogs, dust, and the like. The housing 11 in this embodiment is designed to be cylindrical to facilitate installation and sealing of the wiring circuit and to receive a cable to be electrically connected to the cable connector 10.

The wiring circuit is arranged inside the cable connector 10 to control an on-off of the cable connected with the cable connector 10. Particularly, the wiring circuit includes a first wiring terminal and a second wiring terminal, the wiring terminal and the second wiring terminal are externally led out of the wiring circuit and separately or fixedly connected to an external conductor. For instance, the first wiring terminal and the second wiring terminal are directly and integrally connected to a conductor of the cable or are separated through an breaker element (such as a switch and the like) to fulfill a flexible adjustment of the cable connected to the cable connector. A detection module 22 and a voltage adsorption module 21 are arranged between the first wiring terminal and the second wiring terminal. The voltage adsorption module 21 is arranged in the wiring circuit to prevent a car battery and other car batteries such as rescue car batteries against the impact of a high-voltage pulse and high-voltage static electricity generated by the car batteries, and accordingly, the voltage adsorption module 21 includes a piezoresistor bridged between the first wiring terminal and the second wiring terminal. The piezoresistor performs voltage clamping when the circuit withstands an over-voltage to absorb an excess current to protect a sensitive device. Particularly, when the voltage flowing through applied to the piezoresistor is lower than a threshold "UN" of the piezoresistor, a current flowing through the piezoresistor is extremely small, so that the piezoresistor is equivalent to a closed valve; and when the voltage exceeds the UN, the resistance of the piezoresistor becomes small, and in this way, the current flowing through the piezoresistor sharply increases and has little impact on other circuits, so that the influence of the over-voltage on a subsequent sensitive circuit is decreased. By means of this function, the piezoresistor can inhibit the abnormal over-voltage frequently generated in the circuit to protect the circuit against damage caused by the over-voltage.

The detection module 22 includes a first switch circuit and a second switch circuit, the first switch circuit and the second switch circuit oppositely bridged between the first wiring terminal and the second wiring terminal. For instance, a current-on direction of the first switch circuit is opposite to that of the second switch circuit, and a potential difference direction of the first switch circuit is opposite to that of the second switch circuit, so that when the first switch circuit and the second switch circuit are simultaneously connected to the first wiring terminal and the second wiring terminal, only one of the first switch circuit and the second switch circuit is turned on, and the other one of the first switch circuit and the second switch circuit is in an off state, so that different connection conditions of the first wiring terminal and the second wiring terminal connected to different poles or devices can be distinguished.

The first switch circuit and the second switch circuit respectively include a first illumination unit and a second illumination unit. When the first switch circuit is turned on, a current flowing through the first illumination unit activates the first illumination unit to illuminate; and on the contrary, when the second switch circuit is turned on, a current flowing through the second switch circuit activates the second illumination unit to illuminate. By adoption of the above configuration, when the first wiring terminal and the second wiring terminal are normally positively connected to two power supplies, mutual power supply between the two power supplies should be established through the first wiring terminal and the second wiring terminal as needed, and at this moment, the current direction is identical to the on direction of the first switch circuit, so that the first switch circuit is turned on, and the first illumination unit is controlled to illuminate to send out a display signal to notify a user that the first switch circuit indicating a normal connection is turned on currently; and when the first wiring terminal and the second wiring terminal are abnormally positively connected to the two power supplies, for instance, when positive and negative poles are reversed, the first wiring terminal and the second wiring terminal are disconnected as needed, the two power supplies cannot supply power to each other, and at this moment, the current direction is identical to the on direction of the second switch circuit, so that the second switch circuit is turned on, and the second illumination unit is controlled to illuminate to send out a display signal to notify the user that the second switch circuit indicating an abnormal connection is turned on currently. By means of the above functions, the user can clearly know whether or not the cable provided with the cable connector 10 is correctly connected to the car batteries, and if the cable is connected to a reverse pole, the cable can be disconnected in time to be connected again. In a transitory reverse connection moment, the piezoresistor is configured to protect the cable against the over-current, the over-voltage, the high-voltage static, and the like during the reverse connection. In some embodiments, the first illumination unit and the second illumination unit are integrated with a first diode and a second diode to save occupation of the circuit on a PCB. For instance, light-emitting diodes are selected as the first diode and the second diode.

Figure 2:
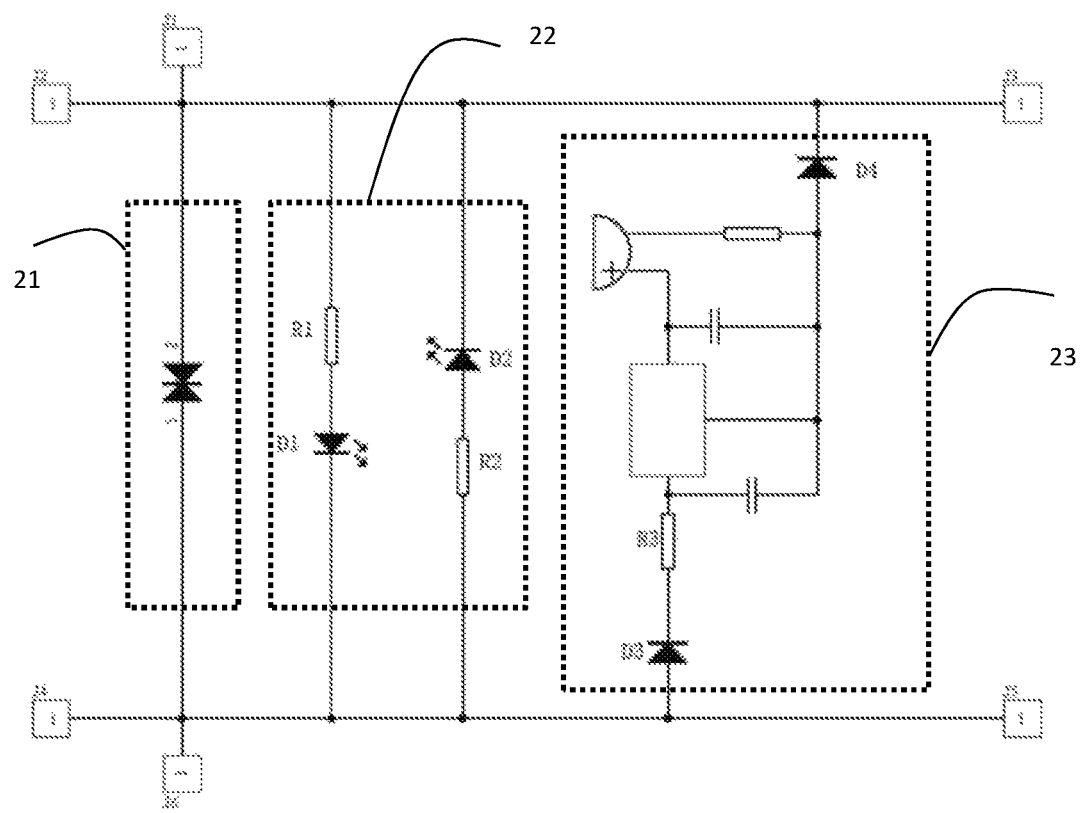
FIG. 2 is a structural view of a wiring circuit in the cable connector in the preferred embodiment of the invention.

FIG. 2 shows a structure view of the wiring circuit in an embodiment of the invention. In this preferred embodiment, the first switch circuit includes a first resistor R1 and the first diode D1 which are connected in series, wherein when the first resistor R1 and the first diode D1 are connected in series, one terminal of the first resistor R1 is connected to the first wiring terminal, the other terminal of the resistor R1 is connected to a positive pole of the first diode D1, and a negative pole of the first diode D1 is connected to the second wiring terminal; and the second switch circuit includes a second resistor R2 and a second diode D2, the second resistor R2 and the second diode D2 are connected in series, wherein when the second resistor R2 and the second diode D2 are connected in series, one terminal of the second resistor R2 is connected to the second wiring terminal, the other terminal of the second resistor R2 is connected to a positive pole of the second diode D2, and a negative pole of the second diode D2 is connected to the first wiring terminal. When the first wiring terminal and the second wiring terminal are positively connected to the two power supplies, that is, when the first wiring terminal is connected to a positive pole and the second wiring terminal is connected to a negative pole, a current-on direction of the first diode D1 is identical to a current direction between the first wiring terminal and the second wiring terminal, so that the first diode D1 is turned on; and at this moment, a current-on direction of the second diode D2 is opposite to the current direction between the first wiring terminal and the second wiring terminal, so that the second diode D2 is in an off state, and the first wiring terminal and the second wiring terminal are connected through the first switch circuit. When the first wiring terminal and the second wiring terminal are negatively connected to the two power supplies, that is, when the first wiring terminal is connected to the negative pole and the second wiring terminal is connected to the positive pole, the current-on direction of the second diode D2 is identical to the current direction between the first wiring terminal and the second wiring terminal, so that the second diode D2 is turned on; and at this moment, the current-on direction of the first diode D1 is opposite to the current direction between first wiring terminal and the second wiring terminal, the first diode D1 is in an off state, and the first wiring terminal and the second wiring terminal are connected through the second switch circuit. That is, the first diode D1 and the second diode D2 are alternatively turned on to control different turn-on paths between the first wiring terminal and the second wiring terminal.

In other embodiments, switch circuits of different structures can also be alternatively turned on by means of a relay or a one-way valve.

To prevent a high-current breakdown of the two power supplies on the diodes during the reverse connection, the first resistor R1 and the second resistor R2 are configured as follows: the resistance of the first resistor R1 is between 500Ω-1500Ω, and the resistance of the second resistor R2 is between 1000Ω-3000Ω. In a word, the resistance of the second resistor R2 is greater than that of the first resistor R1 to protect the second diode D2.

In another preferred or optional embodiment, the wiring circuit further includes an alarm module bridged between the first wiring terminal and the second wiring terminal, wherein when the first wiring terminal and the second wiring terminal are negatively connected to the power supplies, the second illumination unit illuminates to notify the user, and the alarm module 23 is activated to send out an alarm signal to be distinguished from the feedback of the cable connector during the normal connection and to notify the current problem to the user in multiple dimensions, so that the user can conveniently and rapidly adjust the cable to change a connection manner.

Furthermore, the alarm module 23 includes: a third diode D3, a third resistor R3, a buzzing unit, and a fourth diode D4, wherein one terminal of the third diode D3 is connected to the second wiring terminal, the other terminal of the third diode D3 is connected to the third resistor R3, and the other terminal of the resistor R3 is connected to the buzzing unit; the fourth diode D4 has one terminal connected to the buzzing unit and the other terminal connected to the first wiring terminal; and the third diode D3 has a positive pole connected to the second wiring terminal and a negative pole connected to the third resistor R3. When the first wiring terminal is connected to the negative pole and the second wiring terminal is connected to the positive pole, the on direction of the third diode D3 and the fourth diode D4 are identical to the current direction, so that the third diode D3 and the fourth diode D4 are both turned on; and a current flowing through the buzzing unit activates a buzzer in the buzzing unit. In addition to the buzzer, the buzzing unit further includes an RC circuit connected to positive and negative poles of the buzzer to reduce the noise of the current and a ground terminal used for fulfilling normal operation of the buzzer.

A voltage threshold is preset in the piezoresistor to detect whether or not a voltage between the first wiring terminal and the second wiring terminal is the over-voltage, when the high-voltage static and the high-voltage pulse are generated, that is, when the voltage between the first wiring terminal and the second wiring terminal is greater than the voltage threshold, the piezoresistor absorbs the over-current flowing through the first wiring terminal and the second wiring terminal to protect the whole cable connector and the two power supplies. In a further preferred embodiment, the voltage threshold is set as 33V, and the over-current is less than or equal to 2000 A and is 2000 A in a maximally-absorbed surge circuit, so that the piezoresistor is adapted to different cars such as 12V/24V cars.

In another preferred or optional embodiment, by adoption of a wide-range stable-voltage constant-current power supply, the cable connector has an operating range of DC 6V-30V, thus being adaptable to different cars starting at different voltages.

The cable connector in any one of the above embodiments is tied to a cable clamp. In addition to the cable connector, the cable clamp further includes a cable, the cable is connected to the first wiring terminal and the second wiring terminal respectively and has a clamp part clamping the two car batteries, whether or not the cable is positively connected determines whether the first switch circuit or the second switch circuit is turned on, that is, the cable connector verifies the polarity connection correctness of the cable and protects the car batteries, the cable and the cable connector during the reverse connection.

Figure 3:
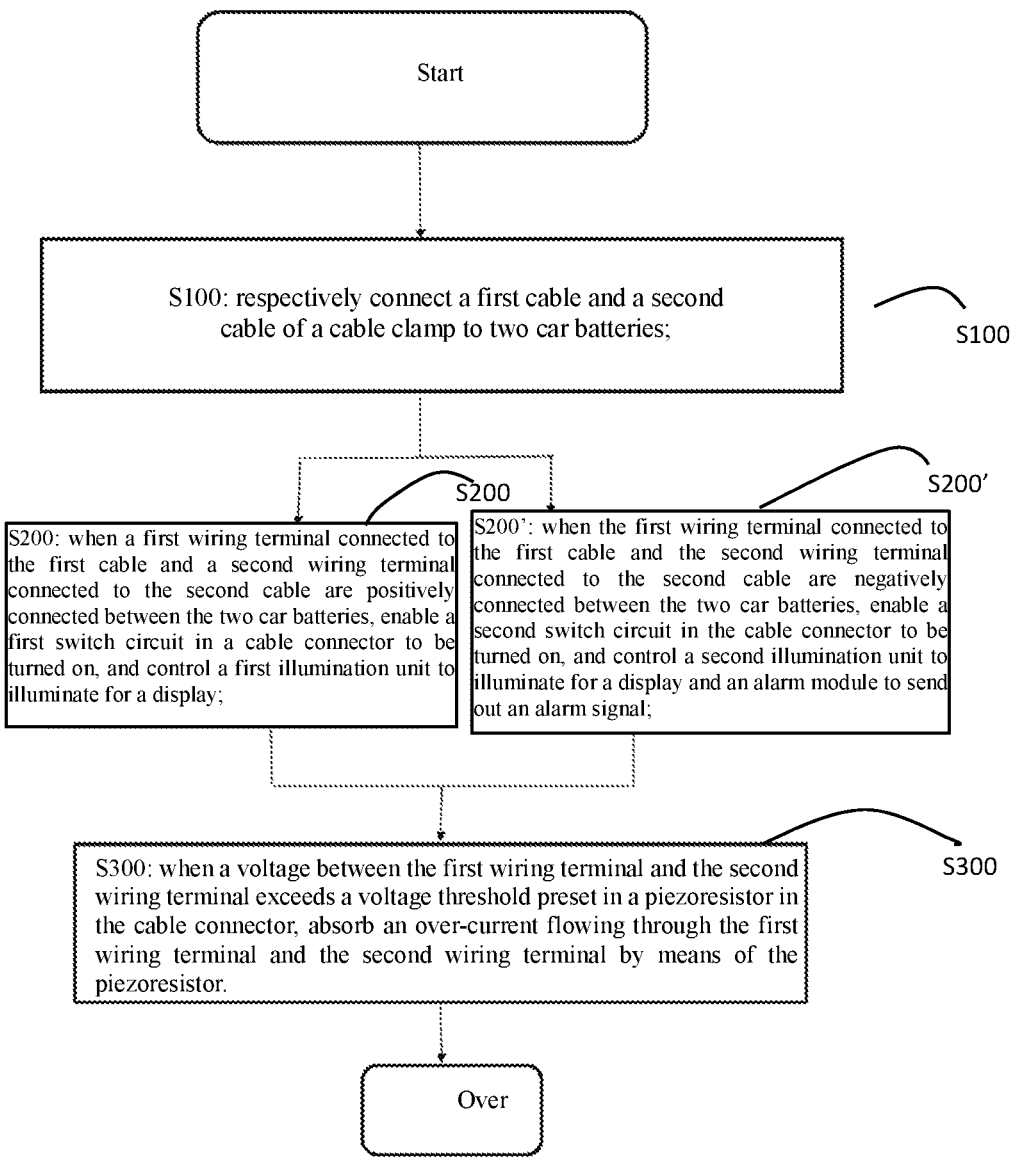
FIG. 3 is a flow diagram of a method for detecting bridging of car batteries in an embodiment of the invention.

Referring to FIG. 3, when the cable clamp is used, bridging of the car batteries is detected through the following steps:

S100: a first cable and a second cable of the cable clamp are respectively connected to two car batteries;

S200: when a first wiring terminal connected to the first cable and a second wiring terminal connected to the second cable are positively connected between the two car batteries, a first switch circuit in a cable connector is turned on, and a first illumination unit is controlled to illuminate for a display;

S200': when the first wiring terminal connected to the first cable and the second wiring terminal connected to the second cable are negatively connected between the two car batteries, a second switch circuit in the cable connector is turned on, a second illumination unit is controlled to illuminate for a display, and an alarm module 23 sends out an alarm signal; and S300: when a voltage between the first wiring terminal and the second wiring terminal exceeds a voltage threshold preset in a piezoresistor in the cable connector, the piezoresistor absorbs an over-current flowing through the first wiring terminal and the second wiring terminal.

It should be noted that the above embodiments are preferred ones of the invention, and are not intended to limit the invention in any form. Those skilled in the art may make changes or modifications on the above technical contents to obtain equivalent effective embodiments without deviating from the contents of the technical solution of the invention, and all changes or equivalent transformations and modifications made on these embodiments according to the technical essence of the invention should also fall within the scope of the technical solution of the invention.

What is claimed is:

1. A cable connector, wherein the cable connector comprises a housing and a wiring circuit, the wiring circuit is arranged inside the housing and the wiring circuit comprises a first wiring terminal, a second wiring terminal, a detection module, and a voltage absorption module, the detection module and the voltage absorption module electrically connected between the first wiring terminal and the second wiring terminal;

the voltage absorption module comprises a piezoresistor bridged between the first wiring terminal and the second wiring terminal;

the detection module comprises a first switch circuit and a second switch circuit, the first switch circuit and the second switch circuit are oppositely bridged between the first wiring terminal and the second wiring terminal to be alternatively turned on, the first switch circuit comprises a first illumination unit, and the second switch circuit comprises a second illumination unit; and when the first wiring terminal and the second wiring terminal are positively connected to two power supplies, the first switch circuit is turned on and the first illumination unit illuminates for a display; and when the first wiring terminal and the second wiring terminal are negatively connected to two power supplies, the second switch circuit is turned on, and the second illumination unit illuminates for a display;

wherein the first switch circuit comprises a first resistor and a first diode connected in series, wherein the first diode has a positive pole connected to the first wiring terminal through the first resistor and a negative pole connected to the second wiring terminal; and the second switch circuit comprises a second resistor and a second diode connected in series, wherein the second diode has a negative pole connected to the first wiring terminal and a positive pole connected to the second wiring terminal through the second resistor.

2. The cable connector according to claim 1, wherein the first resistor has a resistance between 500Ω-1500Ω; the second resistor has a resistance between 1000Ω-3000Ω.

3. A cable clamp, wherein the cable clamp comprises a cable and the cable connector according to claim 2, wherein the cable is connected to the first wiring terminal of the cable connector and the second wiring terminal of the cable connector respectively.

4. The cable connector according to claim 1, wherein the wiring circuit further comprises an alarm module, the alarm module is bridged between the first wiring terminal and the second wiring terminal and the alarm module is activated to send out an alarm signal when the first wiring terminal and the second wiring terminal are negatively connected to the power supplies.

5. The cable connector according to claim 1, wherein a first voltage threshold is preset in the piezoresistor to detect a voltage flowing through the first wiring terminal and the second wiring terminal;
when the voltage flowing through the first wiring terminal and the second wiring terminal is greater than the voltage threshold, the piezoresistor absorbs an over-current flowing through the first wiring terminal and the second wiring terminal.

6. A cable clamp, wherein the cable clamp comprises a cable and the cable connector according to claim 1, wherein the cable is connected to the first wiring terminal of the cable connector and the second wiring terminal of the cable connector respectively.

7. A method for detecting bridging of car batteries, comprising the following steps:
S100: respectively connecting a first cable and a second cable of a cable clamp to two car batteries;
S200: when a first wiring terminal connected to the first cable and a second wiring terminal connected to the second cable are positively connected between the two car batteries, turning on a first switch circuit in the cable connector of claim 1, and controlling a first illumination unit to illuminate for a display;
S200': when the first wiring terminal connected to the first cable and the second wiring terminal connected to the second cable are negatively connected between the two car batteries, turning on a second switch circuit in the cable connector, and controlling a second illumination unit to illuminate for a display and an alarm module to send out an alarm signal; and
S300: when a voltage flowing through the first wiring terminal and the second wiring terminal exceeds a voltage threshold preset in a piezoresistor in the cable connector, absorbing an over-current flowing through the first wiring terminal and the second wiring terminal by means of the piezoresistor.

8. A cable clamp, wherein the cable clamp comprises a cable and the cable connector according to claim 1, wherein the cable is connected to the first wiring terminal of the cable connector and the second wiring terminal of the cable connector respectively.

9. A cable clamp, wherein the cable clamp comprises a cable and the cable connector according to claim 1, wherein the cable is connected to the first wiring terminal of the cable connector and the second wiring terminal of the cable connector respectively.

10. A cable clamp, wherein the cable clamp comprises a cable and the cable connector according to claim 1, wherein the cable is connected to the first wiring terminal of the cable connector and the second wiring terminal of the cable connector respectively.

11. A cable connector, wherein the cable connector comprises a housing and a wiring circuit, the wiring circuit is arranged inside the housing and the wiring circuit comprises a first wiring terminal, a second wiring terminal, a detection module, and a voltage absorption module, the detection module and the voltage absorption module electrically connected between the first wiring terminal and the second wiring terminal;
the voltage absorption module comprises a piezoresistor bridged between the first wiring terminal and the second wiring terminal;
the detection module comprises a first switch circuit and a second switch circuit, the first switch circuit and the second switch circuit are oppositely bridged between the first wiring terminal and the second wiring terminal to be alternatively turned on, the first switch circuit comprises a first illumination unit, and the second switch circuit comprises a second illumination unit; and
when the first wiring terminal and the second wiring terminal are positively connected to two power supplies, the first switch circuit is turned on and the first illumination unit illuminates for a display; and
when the first wiring terminal and the second wiring terminal are negatively connected to two power supplies, the second switch circuit is turned on, and the second illumination unit illuminates for a display;
wherein the wiring circuit further comprises an alarm module, the alarm module is bridged between the first wiring terminal and the second wiring terminal and the alarm module is activated to send out an alarm signal when the first wiring terminal and the second wiring terminal are negatively connected to the power supplies;
wherein the alarm module comprises a third diode, a third resistor, a buzzing unit, and a fourth diode;
one terminal of the third diode is connected to the second wiring terminal and the other terminal of the third diode is connected to one terminal of the third resistor;
the other terminal of the third resistor is connected to the buzzing unit;
one terminal of the fourth diode is connected to the buzzing unit and the other terminal of the fourth diode is connected to the first wiring terminal; and
a positive pole of the third diode is connected to the second wiring terminal and a negative pole of the third diode is connected to the third resistor.

12. The cable connector according to claim 11, wherein the first switch circuit comprises a first resistor and a first diode connected in series, wherein the first diode has a positive pole connected to the first wiring terminal through the first resistor and a negative pole connected to the second wiring terminal; and the second switch circuit comprises a second resistor and a second diode connected in series, wherein the second diode has a negative pole connected to the first wiring terminal and a positive pole connected to the second wiring terminal through the second resistor.

13. A cable clamp, wherein the cable clamp comprises a cable and the cable connector according to claim 11, wherein the cable is connected to the first wiring terminal of the cable connector and the second wiring terminal of the cable connector respectively.

14. A cable connector, wherein the cable connector comprises a housing and a wiring circuit, the wiring circuit is arranged inside the housing and the wiring circuit comprises a first wiring terminal, a second wiring terminal, a detection module, and a voltage absorption module, the detection module and the voltage absorption module electrically connected between the first wiring terminal and the second wiring terminal;

the voltage absorption module comprises a piezoresistor bridged between the first wiring terminal and the second wiring terminal;

the detection module comprises a first switch circuit and a second switch circuit, the first switch circuit and the second switch circuit are oppositely bridged between the first wiring terminal and the second wiring terminal to be alternatively turned on, the first switch circuit comprises a first illumination unit, and the second switch circuit comprises a second illumination unit; and when the first wiring terminal and the second wiring terminal are positively connected to two power supplies, the first switch circuit is turned on and the first illumination unit illuminates for a display; and when the first wiring terminal and the second wiring terminal are negatively connected to two power supplies, the second switch circuit is turned on, and the second illumination unit illuminates for a display;

wherein a first voltage threshold is preset in the piezoresistor to detect a voltage flowing through the first wiring terminal and the second wiring terminal;

when the voltage flowing through the first wiring terminal and the second wiring terminal is greater than the voltage threshold, the piezoresistor absorbs an over-current flowing through the first wiring terminal and the second wiring terminal;

wherein the voltage threshold is 33V, and the over-current is less than or equal to 2000 A.

15. A cable clamp, wherein the cable clamp comprises a cable and the cable connector according to claim 14, wherein the cable is connected to the first wiring terminal of the cable connector and the second wiring terminal of the cable connector respectively.

* * * * *